United States Patent [19]
Iwata et al.

[11] Patent Number: 5,930,169
[45] Date of Patent: Jul. 27, 1999

[54] NONVOLATILE SEMICONDUCTOR MEMORY DEVICE CAPABLE OF IMPROVING OF CHIP'S LIFETIME AND METHOD OF OPERATING THE SAME

[75] Inventors: Yoshihisa Iwata, Yokohama; Tomoko Yamane, Tokyo, both of Japan

[73] Assignee: Kabushiki Kaisha Toshiba, Kawasaki, Japan

[21] Appl. No.: 09/020,839

[22] Filed: Feb. 9, 1998

[30] Foreign Application Priority Data

Feb. 19, 1997 [JP] Japan ................................ 9-026522

[51] Int. Cl.$^6$ .................................................. G11C 16/00
[52] U.S. Cl. ................................. 365/185.09; 365/185.22
[58] Field of Search ......................... 365/185.09, 185.22, 365/185.28, 185.29, 185.18, 185.3

[56] References Cited

U.S. PATENT DOCUMENTS

| | | |
|---|---|---|
| 5,278,794 | 1/1994 | Tanaka et al. ...................... 365/185.17 |
| 5,361,227 | 11/1994 | Tanaka et al. ...................... 365/189.01 |
| 5,452,248 | 9/1995 | Naruke et al. ..................... 365/185.09 |
| 5,530,675 | 6/1996 | Hu ......................................... 365/185.3 |
| 5,608,672 | 3/1997 | Tang et al. ........................... 365/185.3 |
| 5,657,270 | 8/1997 | Ohuchi et al. ..................... 365/185.22 |
| 5,699,298 | 12/1997 | Shiau et al. ........................ 365/185.22 |
| 5,856,944 | 1/1999 | Prickett, Jr. et al. .............. 365/185.22 |

*Primary Examiner*—Tan T. Nguyen
*Attorney, Agent, or Firm*—Banner & Witcoff. Ltd.

[57] ABSTRACT

Electrically erasable and writable nonvolatile memory cells are arranged. After erasing the data in at least part of the memory cells, light-writing is done by applying, to the memory cells erased from, a bias whose pulse width is shorter or whose write voltage is lower than in an ordinary write operation. Then, a property-degraded cell which is in a written state is detected from among the memory cells subjected to light-writing. Because the property-degraded cell can be found in this way, the lifetime of the chip can be improved by, for example, replacing the defective cell with a normal cell.

21 Claims, 10 Drawing Sheets

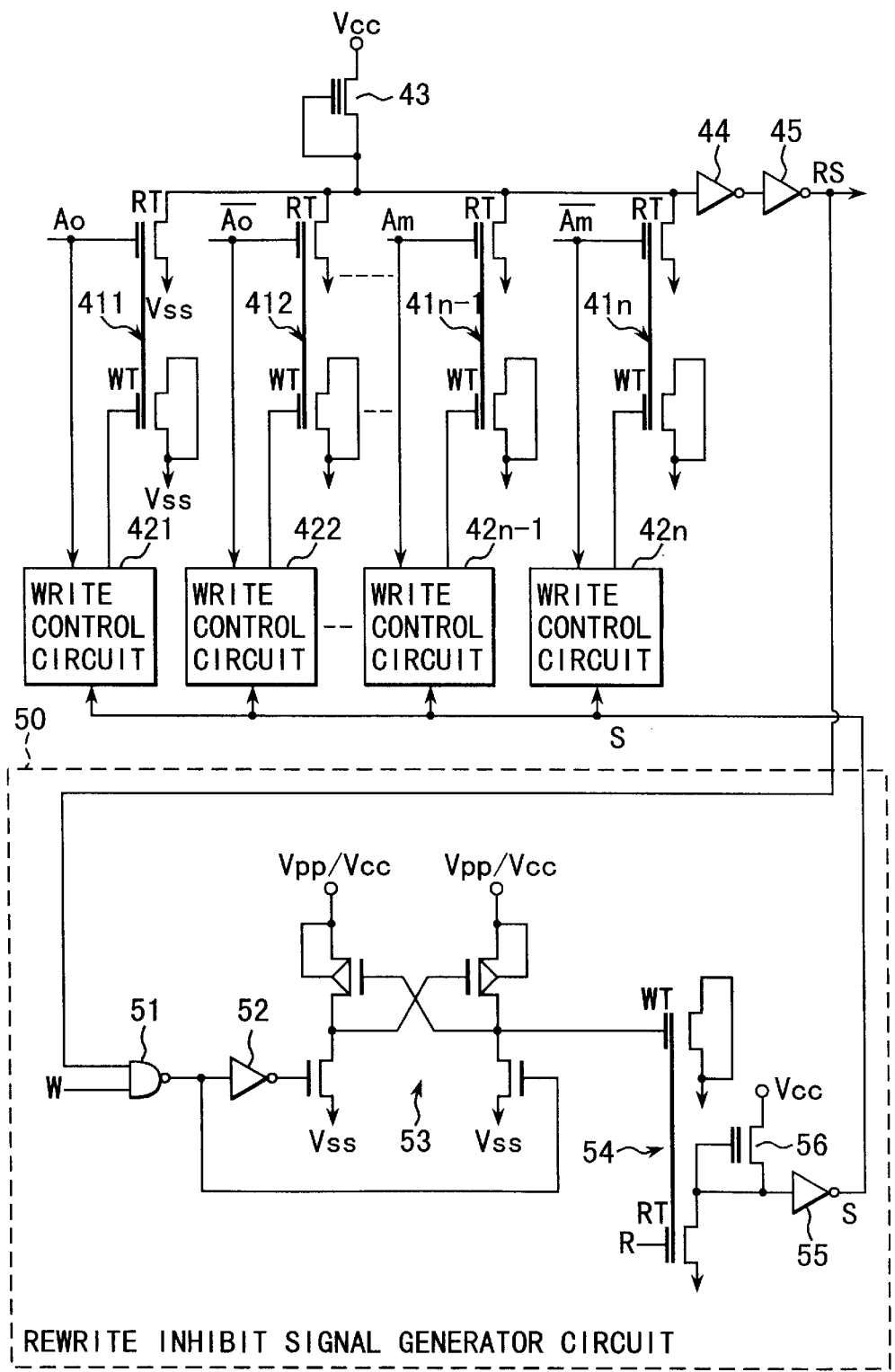
F I G. 5

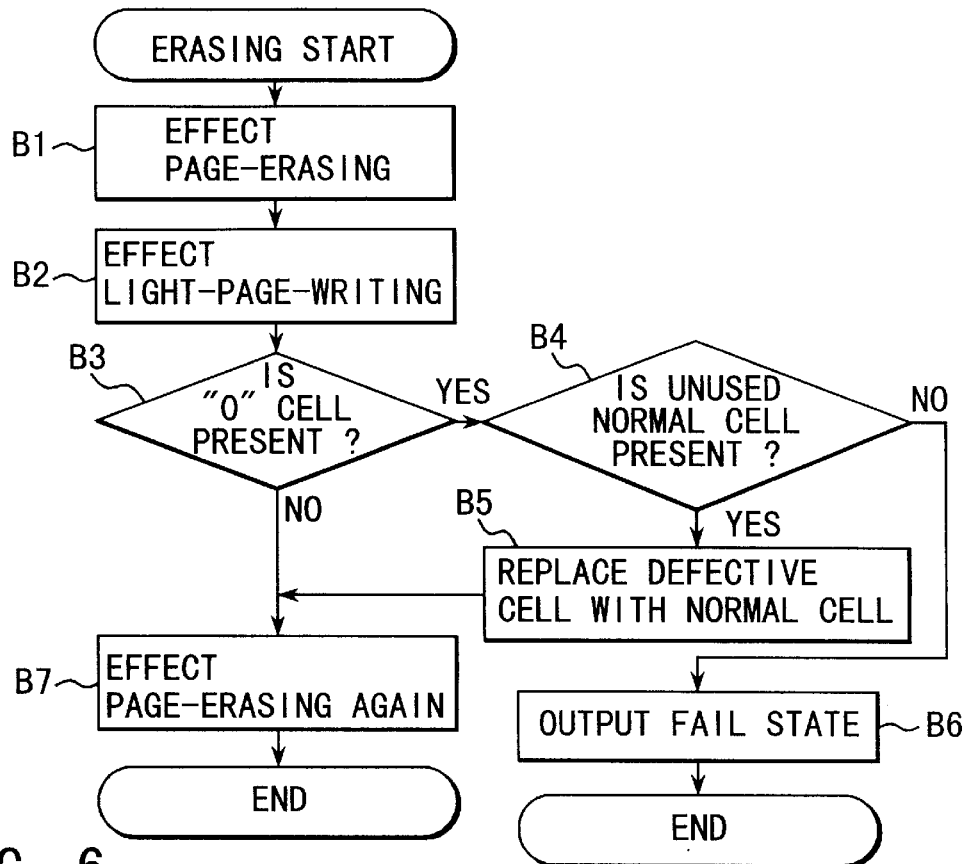
F I G. 6
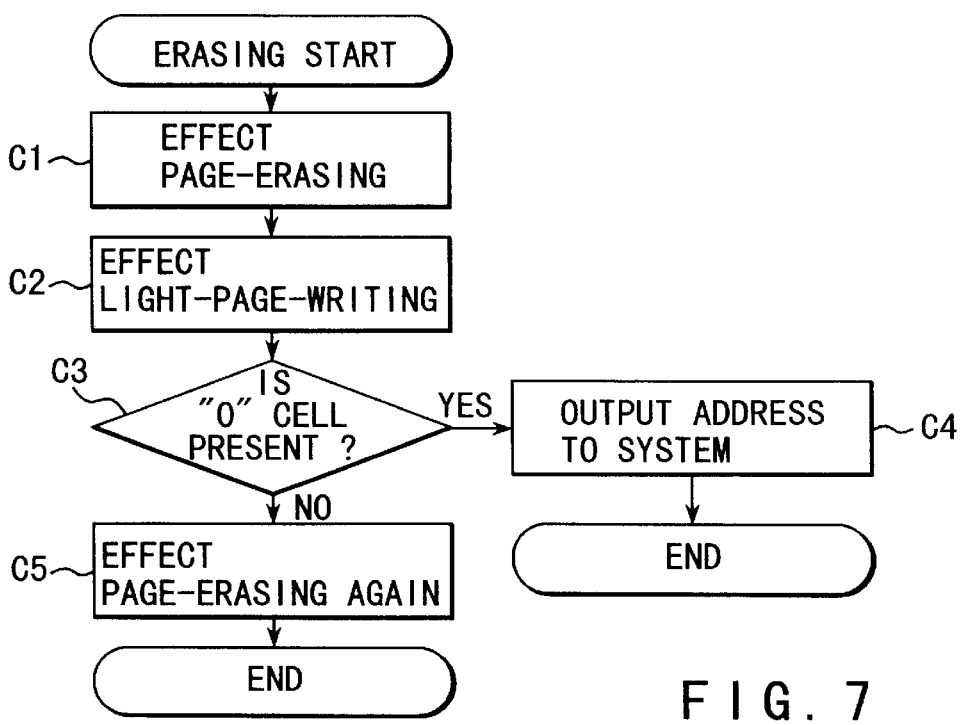
F I G. 7

NONVOLATILE SEMICONDUCTOR MEMORY DEVICE CAPABLE OF IMPROVING OF CHIP'S LIFETIME AND METHOD OF OPERATING THE SAME

BACKGROUND OF THE INVENTION

The present invention relates to an electrically erasable and writable nonvolatile semiconductor memory device and a method of operating the semiconductor memory device.

FIG. 1 is a sectional view of an ordinary NAND nonvolatile memory cell. As shown in FIG. 1, a p-type well diffusion layer 102 is formed within an n-type silicon substrate 101, whereas an n-type source diffusion layer 103 and an n-type drain diffusion layer 104 are formed within a p-type well diffusion layer 102. On a channel region 109 between the source diffusion layer 103 and a drain diffusion layer 104, a gate insulating film 105 is formed. The gate insulating film 105 has a thickness of, for example, about 10 nm. On the gate insulating film 105, a floating gate 106 is formed. On the floating gate 106, an interlayer insulating film 107 is formed. On the interlayer insulating film 107, a control gate 108 is formed.

Hereinafter, the operations of erasing, writing, and reading data in the memory cell will be explained.

First, the operation of erasing data will be described.

A voltage of 0 V is applied to the control gate 108, thereby making the drain diffusion layer 104 open. Then, for example, 19 V is applied to the source diffusion layer 103, p-type well diffusion layer 102, and n-type silicon substrate 101, thereby pulling electrons out of the floating gate 106 into the p-type well diffusion layer 102 in the form of tunnel current. As a result, the data stored in the memory cell is erased.

Next, the data writing sequence will be described by reference to FIG. 2.

The data in all of the memory cells is erased by the above-described method (step A1). Then, for example, a programming voltage of 18 V is applied to the control gate 108 and the source diffusion layer 103, drain diffusion layer 104, and p-type diffusion layer 102 are set at 0 V, thereby injecting electrons from the channel region 109 into the floating gate 106 in the form of tunnel current. In this way, data is written into a specific memory cell (step A2). Thereafter, it is verified whether the data has been written correctly (step A3). If the data has not been written correctly, the data will be written again into the memory cell which has failed to be written into. This is repeated until all of the memory cells have been written into.

The act of writing data little by little while verifying the data is called verify-writing. The verify-writing is done to prevent the generation of an overprogramed cell. An overprogramed cell is a cell whose threshold voltage is higher than the potential of an unselected word line in a read operation. A memory cell whose writing speed is high is liable to be an overprogramed cell and contributes to erroneous reading. To prevent this, in the verify-writing, additional writing is done to a memory cell whose writing speed is low as shown in FIG. 2, with inhibiting the writing to the memory cells which was verified that the sufficient writing has already been done. The additional writing is carried out such that the threshold voltage distribution of all memory cells falls within a desired range by making the write pulse longer gradually or raising the programming voltage gradually.

Next, the process of reading data will be explained.

In data reading, a read voltage of 0 V is applied to the control gate 108 and a voltage of 2 V is applied to a bit line. At that time, detecting whether or not a current has flown through the bit line gives data on an erased state of "1" or a written state of "0". Hereinafter, a memory cell in the erased state is referred to as a "1" cell and a memory cell in the written state is a "0" cell.

At that time, in the unselected memory cells connected in NAND form to a memory cell to be read from, an unselected word-line potential of, for example, 5 V is applied to their control gates 108, thereby keeping the gates in the on state. In the unselected cells whose control gates 108 are applied with 5 V, if there is an overprogramed cell whose threshold voltage is higher than 5 V, no current will flow from the bit line. As a result, information on the selected memory cell cannot be read correctly.

Specifically, because the unselected word line potential is applied to the control gates 108 of the unselected cells during data reading as described above, the unselected word-line potential causes electrons to be injected into the floating gates 106 of the memory cells in the "1" cell state, which may change the "1" cells to "0" cells. The phenomenon is called "read disturb". The read disturb is found not only in the NAND nonvolatile memory but also the NOR nonvolatile memory, which has become a problem.

The difficulty of the read disturb occurring (resistance to read disturb) becomes less as the data writing and erasing are repeated more. Specifically, the repetition of writing and erasing permits carriers to be trapped in the gate insulating film 105, with a result that a current flows because of the trap, which destroys the insulating properties of the insulating film of the memory cell gradually. Once the insulating properties have been destroyed, the amount of electrons injected by the unselected word-line potential into the floating gates 106 increases.

FIG. 3 shows the threshold voltage distribution of the memory cells when all of the memory cells have been brought into the erased state after the repetition of the writing and erasing and then a read disturb stress has been applied to the cells. When the read disturb stress is applied, there appears a group of worst cells (corresponding to the region 91) having a certain distribution and a group of property-degraded memory cells (corresponding to the region 92) whose threshold voltages fluctuate more than those of the worst cell group (usually, the threshold voltages become much higher than the ordinary reading voltage). The property-degraded cell group whose threshold voltage fluctuates more has a lower resistance to read disturb than the other memory cells (in the case of a normal memory cell, the limit value of the number of times of writing and erasing is $10^5$ to $10^6$, whereas in the case of a property-degraded cell, it is $10^3$ to $10^4$), resulting in a shorter lifetime of a chip.

As described above, in the nonvolatile memory, the repetition of writing and erasing permits read disturb to occur, which results in an decrease in the limit value of the number of times of writing and erasing in the property-degraded cell (corresponding to the region 92), shortening the lifetime of the chip. Since such a property-degraded cell appears only when writing and erasing are repeated, a method of detecting property-degraded cells in a conventional test before the use of a chip has not been established. The reason is that since the repetition of writing and erasing in a test decreases the number of times of writing and erasing before the shipment of the tested chip or might make the chip unusable, such a method cannot be used to detect a property-degraded cell.

With this backdrop, it is desired that the lifetime of a chip is improved in a nonvolatile semiconductor memory device by easily finding property-degraded cells whose resistance to read disturb is low (or whose threshold voltage fluctuates seriously) and by, for example, replacing them with redundant memory cells.

BRIEF SUMMARY OF THE INVENTION

Accordingly, it is an object of the present invention to provide a nonvolatile semiconductor memory device capable of improving the lifetime of a chip and a method of operating the memory device.

It is another object of the present invention to provide a nonvolatile semiconductor memory device capable of easily detecting a property-degraded cell whose resistance to read disturb is low (or whose threshold voltage fluctuates seriously) and an operating method of enabling the detection.

According to one aspect of the present invention, there is provided a nonvolatile semiconductor memory device comprising: a memory cell array in which electrically erasable and writable nonvolatile memory cells are arranged; a control circuit for erasing data in at least part of the memory cells in the memory cell array and effecting light-writing by applying a bias to the part of the memory cells such that an electric field smaller than in an ordinary write operation may develop at gate insulating films of the memory cells; and a detecting circuit for detecting a property-degraded cell which is in a written state from among the memory cells subjected to light-writing.

According to another aspect of the present invention, there is provided a nonvolatile semiconductor memory device comprising: a memory cell array in which electrically erasable and writable nonvolatile memory cells are arranged; a control circuit for erasing data in at least part of the memory cells in the memory cell array and effecting light-writing by applying to the part of the memory cells a bias whose pulse width is shorter or whose write voltage is lower than in an ordinary write operation; and a detecting circuit for detecting a property-degraded cell which is in a written state from among the memory cells subjected to light-writing.

The device may further comprise a replacement control circuit for performing control to replace the property-degraded cell with an unused normal cell in accordance with the detecting circuit detecting the property-degraded cell. In this case, the replacement control circuit may select the unused normal memory cell from a redundant memory cell array. The replacement control circuit may output a replacement impossible signal when there is no unused normal memory cell.

In the device, the detecting circuit may output an address for the property-degraded cell when detecting the property-degraded cell. In this case, the device may further comprise a replacement circuit for performing control to replace the property-degraded cell with an unused normal cell in accordance with the address outputted from the detecting circuit. Also, the replacement control circuit may include a circuit for storing the address for the property-degraded cell outputted from the detecting circuit.

In the device, the control circuit may execute an ordinary erase operation after effecting light-writing and detecting.

In the device, the control circuit may execute an ordinary write operation after effecting light-writing and the detecting.

In the device, the control circuit may write specific data previously saved for a test mode process after effecting light-writing and detecting.

According to another aspect of the present invention, there is provided a method of operating a nonvolatile semiconductor memory device, comprising the steps of: erasing data in at least part of memory cells in a memory cell array in which electrically erasable and writable nonvolatile memory cells are arranged; effecting light-writing by applying a bias to the part of the memory cells erased from such that an electric field smaller than in an ordinary write operation may develop at gate insulating films of the memory cells; and detecting a property-degraded cell which is in a written state from among the memory cells subjected to light-writing.

According to another aspect of the present invention, there is provided a method of operating a nonvolatile semiconductor memory device, comprising the steps of: erasing data in at least part of memory cells in a memory cell array in which electrically erasable and writable nonvolatile memory cells are arranged; effecting light-writing by applying to the part of the memory cells erased from a bias whose pulse width is shorter or whose write voltage is lower than in an ordinary write operation; and detecting a property-degraded cell which is in a written state from among the memory cells subjected to light-writing.

The method may further comprise the step of performing control to replace the property-degraded cell with an unused normal cell when the property-degraded cell has been detected in the detecting step. In this case, the replacement control step may include selecting the unused normal memory cell from a redundant memory cell array. Also, the replacement control step may include the step of outputting a replacement impossible signal when there is no unused normal memory cell.

The detecting step may include the step of outputting an address for the property-degraded cell when detecting the property-degraded cell. In this case, the method may further comprise the step of replacing the property-degraded cell with an unused normal cell in accordance with the address outputted in the detecting step.

The method may further comprise the step of executing an ordinary erase operation after the light-writing step and the detecting step.

The method may further comprise the step of executing an ordinary write operation after the light-writing step and the detecting step.

The method may further comprise the step of writing specific data previously saved for a test mode process after the light-writing step and the detecting step.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5 is a circuit diagram of a nonvolatile defective-address storage circuit provided in the replacement control circuit in FIG. 4;

FIG. 6 is a flowchart for the operation of a first embodiment of the present invention;

FIG. 7 is a flowchart for the operation of a second embodiment of the present invention;

DETAILED DESCRIPTION OF THE INVENTION

Hereinafter, referring to the accompanying drawings, embodiments of the present invention will be explained.

Figure 1:
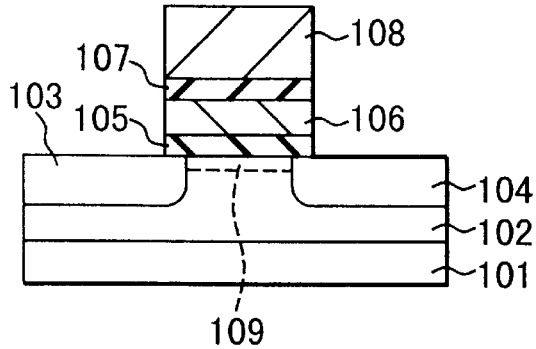
FIG. 1 is a sectional view of a NAND nonvolatile memory.
Figure 2:
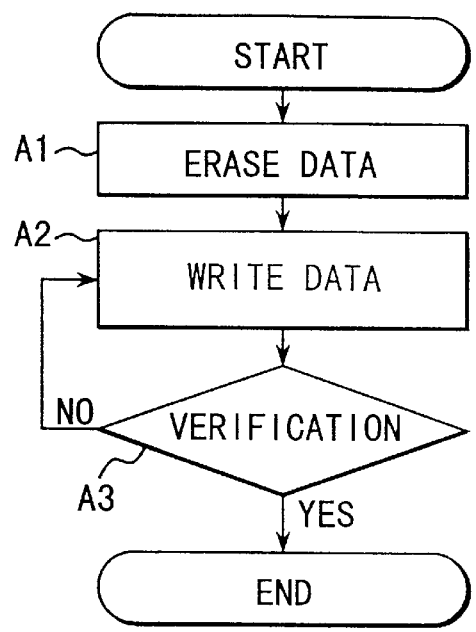
FIG. 2 is a flowchart for a write operation in a NAND memory.
Figure 3:
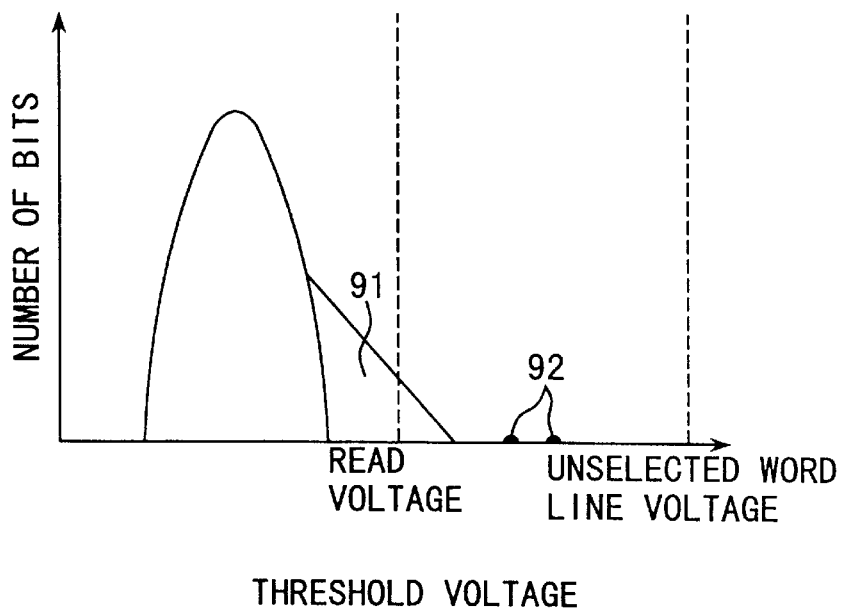
FIG. 3 shows the distribution of the threshold voltage of the memory cells to which a read disturb stress has been applied.
Figure 4:
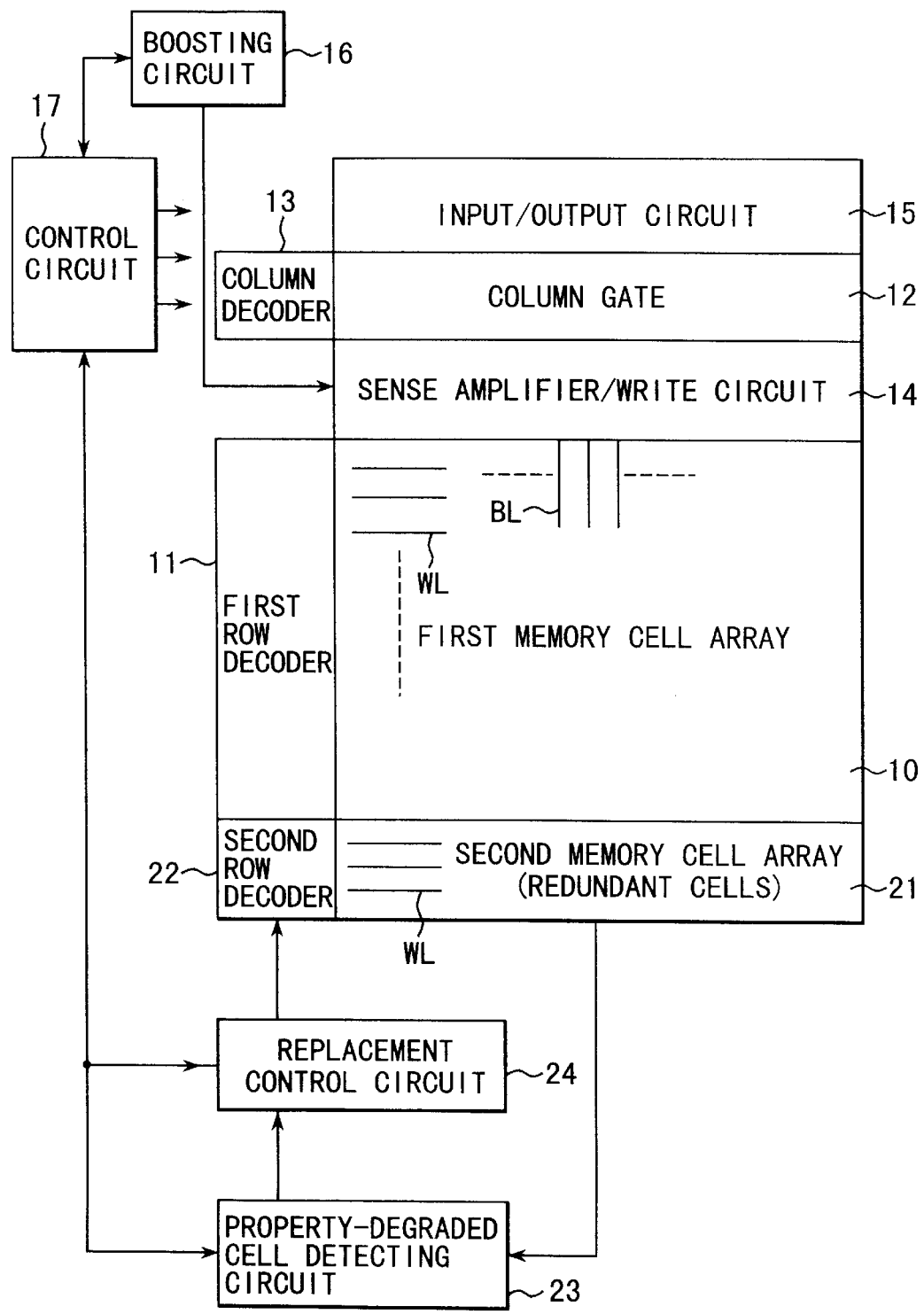
FIG. 4 is a block diagram of a schematic configuration of a nonvolatile semiconductor memory device according to the present invention.

FIG. 4 is a block diagram of a nonvolatile semiconductor memory device according to a first embodiment of the present invention. The semiconductor memory device is, for example, a NAND EEPROM.

In the EEPROM of FIG. 4, a first memory cell array 10 is composed of memory cells arranged in a matrix and has a plurality of word lines WL and a plurality of bit lines BL.

A first row decoder 11 selectively drives the word lines WL of the first memory cell array 10 on the basis of an externally entered address. The first row decoder is composed of a decoder for decoding an input address signal and a word-line driver for supplying a specific voltage to the word lines in accordance with the output of the decoder when data is written, erased, or read.

A column decoder 13 controls the column gate 12 on the basis of an externally entered address. A sense amplifier/write circuit 14 is connected to the bit lines BL of the first memory cell array 10. An input/output circuit 15 is connected to the column gate 12. The sense amplifier/write circuit 14 is selectively connected to the input/output circuit 15 through the column gate 12 on the basis of the externally entered address. A boosting circuit 16 supplies a high voltage necessary for a write operation or an erase operation.

A control circuit 17 executes the operation of erasing the data from a memory cell, writing data into a memory cell, or reading the data from a memory cell. Furthermore, the control circuit 17 of the embodiment is capable of executing light-writing such that the threshold voltage of a normal memory cell may be lower than the read voltage in a read operation. In light-writing, a bias with either a shorter pulse width or a lower write voltage than in an ordinary write operation is applied to the memory cells. Namely, the bias is applied to the gate such that a smaller electric field than in an ordinary write operation may develop at the gate insulating film. The bias at that time is exerted such that the threshold value of a memory cell may not be larger than the read voltage in a read operation.

The purpose of light-writing is to enable property-degraded cell detecting circuit 23 to detect a property-degraded cell whose resistance to read disturb is low (or whose threshold voltage fluctuates seriously) as described in detail later.

A second memory cell array 21 for redundancy is composed of redundant memory cells similar to the memory cells in the first memory cell array 10. The second memory cell array has a plurality of word lines WL and a plurality of bit lines shared with the first memory cell array 10.

A second row decoder 22 for redundancy decodes a specific address in an externally entered addresses. The specific address is programmable and stored in a nonvolatile manner. The second row decoder 22 selectively drives a specific word line WL in the second memory cell array 21 on the basis of the specific address.

A redundant circuit composed of the second memory cell array 21 and second row decoder 22 is used to replace a property-degraded cell with, for example, a redundant memory cell when the property-degraded cell is in the first memory cell array 10.

The property-degraded cell detecting circuit 23 determines whether or not there is any property-degraded cell whose threshold voltage fluctuates seriously in the first memory cell array 10 subjected to light-writing by the control circuit 17. When the property-degraded cell detecting circuit 23 has detected a property-degraded cell, it outputs the address for the property-degraded cell to a replacement control circuit 24 as a detection signal.

On the basis of the detection signal from the property-degraded cell detecting circuit 23, the replacement control circuit 24 checks to see if there is any redundant memory cell that can be replaced. If there is such a redundant memory cell, the replacement control circuit will cause a memory cell in the redundant cell array 21 to be selected in place of the property-degraded cell (or replace the property-degraded cell with a redundant memory cell). If there is no replaceable redundant memory cell, the replacement control circuit will output a replacement impossible signal (or a fail state signal) to a circuit outside the EEPROM. The replacement control circuit 24 is provided with a plurality of nonvolatile defective-address storage circuits for storing a group of the addresses for property-degraded cells.

FIG. 5 shows an example of one of nonvolatile defective-address storage circuits provided in the replacement control circuit 24 of FIG. 4.

Reference symbols 41*l* to 41*n* indicate an n (n=2(m+1)) number of nonvolatile memory cells corresponding to the complementary signals A0, /A0, A1, /A1, . . . , Am, /Am (/ represents an inverted signal) of the individual bits of a defective row address. Each nonvolatile memory cell is composed of a write NMOS transistor WT and a read NMOS transistor RT sharing a floating gate with the transistor WT.

Reference symbols 42*l* to 42*n* indicate an n (n=2(m+1)) number of write control circuits provided so as to correspond to the complementary signals A0, /A0, A1, /A1, . . . , Am, /Am (/ represents an inverted signal) of the individual bits of a defective row address. These write control circuits write data into the corresponding nonvolatile memory cells 41*l* to 41*n* when writing control is carried out to store the address for the property-degraded cell. After the writing, a rewrite inhibit signal generator circuit 50 (explained later) outputs a rewrite inhibit signal S to prevent rewriting.

The write transistor WT in each of the nonvolatile memory cells has its drain and source both connected to a ground node. Their control gates are applied with the outputs of the corresponding write control circuits 42*l* to 42*n*.

For the read transistors RT of the nonvolatile memory cells, their drains are connected in common and their source are connected to a ground node. The complementary signals A0, /A0, A1, /A1, . . . , Am, /Am (/ represents an inverted signal) of the individual bits of a row address are applied to the corresponding gates.

These read transistors RT, together with a depletion-type NMOS transistor 43 for a load connected between the drain common node and a power supply node, forms a NOR circuit. The NOR circuit, together with two stages of inverter circuits 44 and 45 that shape the NOR output, form a defective row address decoder, which supplies an output signal (replacement control signal) RS of a high level when a decode condition is met.

In writing data into the write transistor WT, the threshold voltage is raised higher than a specific value by applying a high write voltage Vpp to its control gate to inject charges into its floating gate through Fowler-Nordheim tunneling. When the data is read from the read transistor RT sharing its floating gate with the write transistor WT, the address bit signal is applied to the control gate as a read voltage. At that time, if the threshold voltage of the read transistor RT is sufficiently higher than the read voltage, the read transistor RT will be in the off state. On the other hand, when the data is read from the read transistor RT sharing its floating gate with a write transistor WT not written into, the threshold voltage of the read transistor RT is sufficiently lower than the read voltage, with the result that the read transistor RT is in the on state.

The rewrite inhibit signal generator circuit 50 comprises a NAND circuit 51 to which a write control signal W and a replacement control signal RS are inputted, a first inverter circuit 52 that inverts the output of the NAND circuit 51, a CMOS latch circuit 53 that latches the output of the first inverter circuit 52 and the output of the NAND circuit 51, a nonvolatile memory cell 54 into which the output of the latch circuit 53 is written, and a second inverter circuit 55 that shapes the read output of the nonvolatile memory cell 54. Usually, Vcc is used as a power supply for the latch circuit 53. To write data into the non-volatile memory cell 54, a write voltage of Vpp is used.

The nonvolatile memory cell 54 is composed of a write NMOS transistor WT and a read NMOS transistor RT sharing a floating gate with the transistor WT. The write transistor WT has its drain and source connected to a ground nod. Its control gate is applied with the output of the latch circuit 53. The read transistor RT has its source connected to a ground node. Between its drain and a power supply node, a depletion-type NMOS transistor 56 for a load is connected. A control signal R is applied to its control gate.

The operation of the rewrite inhibit signal generator circuit 50 constructed as described above will be explained.

The output of the NAND circuit 51 remains at the high level, the output of the latch circuit 53 stays at the ground potential, and the nonvolatile memory cell 54 remains unwritten (remains in the erased state), unless the write signal W goes high. Accordingly, the output of the read transistor RT is low and the output S of the second inverter circuit 55 is high (or at a write enable level).

In contrast, when the write control signal W goes high, the output of the NAND circuit 51 goes low, the output of the first inverter circuit 52 goes high, the output of the latch circuit 53 goes to the write voltage Vpp, and data is written into the nonvolatile memory cell 54, then the output of the read transistor RT goes high and the output S of the second inverter circuit 55 goes low (or at a rewrite inhibit level).

Next, the operation of the defective address storage circuit in FIG. 5 will be explained.

When the defective address storage circuit has not stored any defective address, the floating gates of the nonvolatile cells 41*l* to 41*n* are in a state where electrons have been released (or in the erased state). When an address bit signal is applied as the read potential to the control gate of a read transistor RT, at least one read transistor RT turns on. As a result, the NOR output goes low and the decoder output (replacement control signal RS) goes low, preventing the defective memory cell from being replaced with a redundant memory cell.

In contrast, when the defective address storage circuit has stored a defective row address, the nonvolatile memory cells 41*l* to 41*n* have been written into in accordance with the logic levels of the complementary signals A0, /A0, A1, /A1, . . . , Am, /Am (/ indicates an inverted signal) of the individual bits of the defective row address, respectively (that is, the nonvolatile memory cells are in the erased state). When the bit signal of the defective row address is supplied as the read potential to the control gate of a read transistor RT, all of the read transistors RT go off. As a result, the NOR output goes high and the replacement control signal RS goes high, causing the defective memory cell to be replaced with a redundant cell (a cell block for one line in the embodiment).

Therefore, in the event that there are two or more defective row addresses, the defective row addresses are stored separately in defective address storage circuits. This enables the corresponding defective address storage circuit to output a high replacement control signal RS, when a defective row address is inputted. On the basis of the signal RS, the defective memory cell can be replaced with a redundant memory cell (by selecting a redundant row in the embodiment).

To replace the defective memory cell with a memory cell at a regular address, a memory cell that stores the largest usable address in a nonvolatile manner may be provided inside or outside the memory cell array. When it is provided inside the memory cell array, the address for the memory cell must be outside the regular addresses. Furthermore, a method of using an address conversion memory cell block may be used.

FIG. 6 is a flowchart for the operation of the property-degraded cell detecting circuit 23 and replacement control circuit 24. In the operation, the procedure for detecting a property-degraded cell is built in an erase sequence. In the erase sequence, if there is any property-degraded cell, the cell will be replaced with a normal memory cell.

First, after the erase sequence has started, the data in a page of memory cells connected in common to the selected word line is erased (step B1).

Thereafter, the word line is subjected to light-page-writing with a shorter pulse (e.g., 4 $\mu$sec) than the write pulse in an ordinary write operation such that the threshold voltage of a normal memory cell may be lower than the read voltage in a data read operation (step B2). The light-writing can be implemented using the same pulse width as that in an ordinary write operation. In that case, the write voltage is set in the range of 14 V to 16 V (at a voltage lower than the ordinary write voltage). Since a property-degraded cell 92 whose threshold voltage fluctuates heavily has a faster writing speed than that of a normal memory cell, it becomes a "0" cell as a result of light-writing.

Next, a check is made to see if there is a "0" cell (step B3). This makes it possible to easily identify a property-degraded cell whose threshold voltage fluctuates seriously. Whether or not a "0" is present can be checked in an ordinary read operation, with the potential of the word line being set at a read voltage of 0 V. In that case, whether or not a "0" cell is present may be checked in an erasure-verifying operation. The erasure-verifying operation is the technique for applying a specific erasure-verifying potential to the control gate of a memory cell to be erased from to detect a bit line current and thereby verifying the data erased state.

If a "0" is present, a check will be made to see if there is an unused normal memory cell (step B4). If there is a normal memory cell, the "0" cell will be replaced with a normal memory cell (step B5). The normal memory cell replaced with the "0" cell may be a normal memory cell in the chip or a redundant memory cell prepared as a spare, for example, an EEPROM.

Since a memory cell whose threshold voltage fluctuates seriously has the degraded insulating properties of its insulating film, there is a possibility that the ONO film or tunnel oxide film of the memory cell will be destroyed in use. In that case, even if only the defective memory cell has been replaced with a normal memory cell, the normal memory cells on a word line or in a block to which the memory cell belongs may operate erroneously. To avoid this problem, replacing the defective memory cells with normal memory cells word line by word line or block by block increases the reliability of the chip more.

As a result of a check to see if there is an unused normal memory cell, if there is no unused normal memory cell, a signal indicating a replacement impossible state (a fail state) will be outputted to a circuit outside the memory (step B6) and the operation will be terminated.

When there is no "0" cell or when there is a "0" cell and it is replaced with a normal memory cell, page erasing is done again (step B7) and the operation is completed.

Although in the first embodiment, erasing and light-writing are done page by page as in an ordinary write operation, many pages may be subjected simultaneously to erasing and light-writing when the erasing area extends over many pages.

In the first embodiment, incorporating light-writing into the erase sequence makes it possible to easily identify a property-degraded cell whose threshold voltage fluctuates seriously. Furthermore, replacing a property-degraded cell with a normal memory cell makes the lifetime of the chip longer.

FIG. 7 is a flowchart for the operation of a second embodiment of the present invention. In FIG. 7, a NAND nonvolatile memory device is taken as an example. In the second embodiment, the procedure for detecting a property-degraded cell whose threshold voltage fluctuates greatly is incorporated into an erase sequence. If a property-degraded cell whose threshold voltage fluctuates greatly is present, its address will be outputted to the system and the process be completed.

First, after the erase sequence has been started, page-erasing is done to erase a page of memory cells (step C1).

Thereafter, the word line is subjected to lightpage-writing with a shorter pulse (e.g., 4 $\mu$sec) than the write pulse in an ordinary write operation such that the threshold voltage of a normal memory cell may be lower than the read voltage (step C2). The light-writing can be implemented using the same pulse width as that in an ordinary write operation. In that case, the write voltage is set in the range of 14 V to 16 V (at a voltage lower than the ordinary write voltage). Since a property-degraded cell 92 whose threshold voltage fluctuates heavily has a faster writing speed than that of a normal memory cell, it becomes a "0" cell as a result of light-writing.

Next, a check is made to see if there is a "0" cell (step C3). This makes it possible to easily identify a property-degraded cell whose threshold voltage fluctuates seriously.

If there is a "0" cell, its address will be obtained and outputted to the system (step C4) and the operation be terminated. If there is no "0" cell, erasing will be done again (step C5) and the operation be completed.

While in the second embodiment, erasing and light-writing are done page by page, many pages may be subjected simultaneously to erasing and light-writing when the erasing area extends over many pages.

In the second embodiment, incorporating light-writing into the erase sequence makes it possible to easily identify a property-degraded cell whose threshold voltage fluctuates seriously. By the system preventing use of the property-degraded memory cell, the lifetime of the chip can be made longer.

Figure 8:
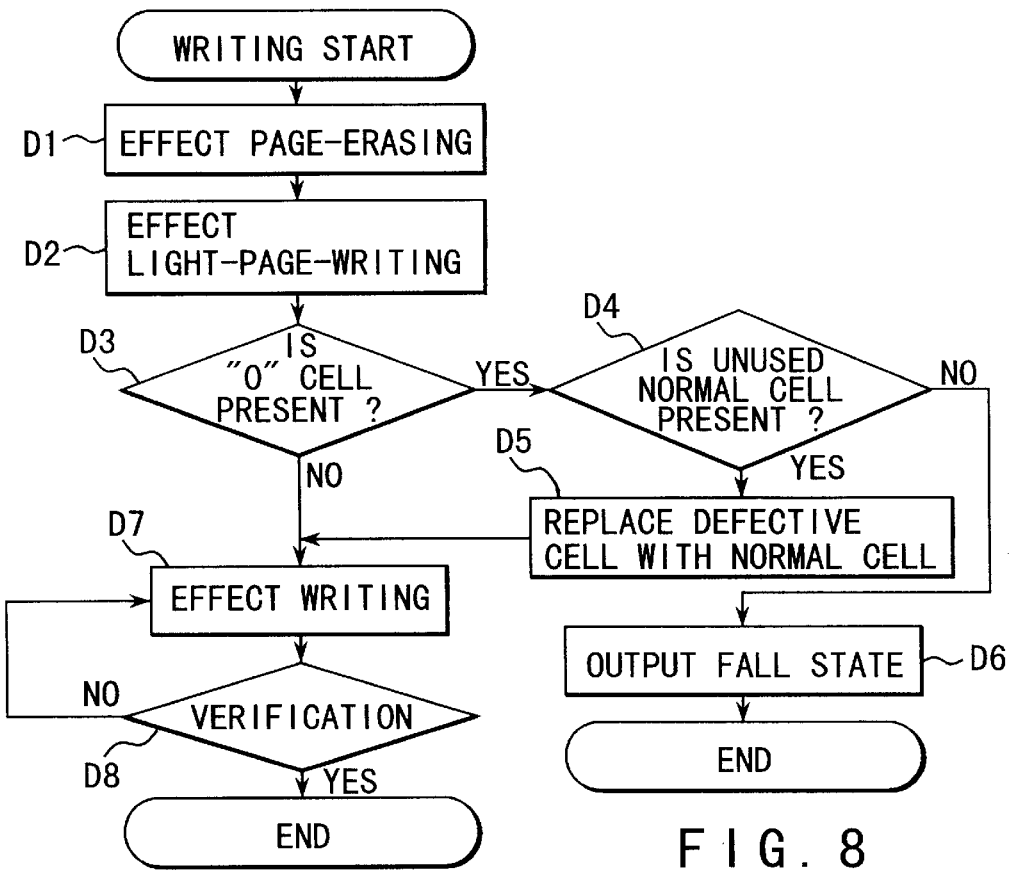
FIG. 8 is a flowchart for the operation of a third embodiment of the present invention.

FIG. 8 is a flowchart for the operation of a third embodiment of the present invention. In FIG. 8, a NAND nonvolatile memory device is taken as an example. In the third embodiment, the operation sequence is a write sequence into which the procedure for detecting a property-degraded cell whose threshold voltage fluctuates greatly is incorporated. If a property-degraded cell whose threshold voltage fluctuates greatly is present, it will be replaced with a normal memory cell.

First, after the write sequence has been started, a page of memory cells to be written into is erased from (step D1).

Thereafter, a word line to be written into is subjected to light-page-writing with a shorter pulse (e.g., 4 $\mu$sec) than the write pulse in an ordinary write operation such that the threshold voltage of a normal memory cell may be lower than the read voltage (step D2). The light-writing can be implemented using the same pulse width as that in an ordinary write operation. In that case, the write voltage is set in the range of 14 V to 16 V (at a voltage lower than the ordinary write voltage). Since a property-degraded cell 92 whose threshold voltage fluctuates heavily has a faster writing speed than that of a normal memory cell, it becomes a "0" cell as a result of light-writing.

Next, a check is made to see if there is a "0" cell (step D3). This makes it possible to easily identify a property-degraded cell whose threshold voltage fluctuates seriously.

If there is a "0" cell, a check will be made to see if there is an unused normal memory cell (step D4). If there is an unused normal memory cell, the "0" cell will be replaced with a normal memory cell (step D5). The normal memory cell may be a normal memory cell in the chip or a redundant memory cell prepared as a spare, for example, an EEPROM. If there is no normal memory cell, a signal indicating a replacement impossible state (a fail state) will be outputted to a circuit outside the memory (step D6) and the operation will be terminated.

Since a memory cell whose threshold voltage fluctuates seriously has the degraded insulating properties of its insulating film, there is a possibility that the ONO film or tunnel oxide film of the memory cell will be destroyed in use. In that case, even if only the memory cell has been replaced with a normal memory cell, the remaining normal memory cells on a word line or in a block to which the defective memory cell belongs may operate erroneously. To avoid this problem, replacing the defective memory cells with normal memory cells word line by word line or block by block increases the reliability of the chip more.

When there is no "0" cell or when there is a "0" cell and it is replaced with a normal memory cell, normal writing and verification are repeated (step D7 and D8) and the operation is completed.

While in the third embodiment, erasing and light-writing are done page by page, many pages may be subjected simultaneously to erasing and light-writing when the erasing area extends over many pages.

As described above, in the third embodiment, incorporating light-writing into the write sequence makes it possible to easily identify a property-degraded cell whose threshold voltage fluctuates seriously. Furthermore, replacing a property-degraded cell whose threshold voltage fluctuates seriously with a normal memory cell makes the lifetime of the chip longer.

Figure 9:
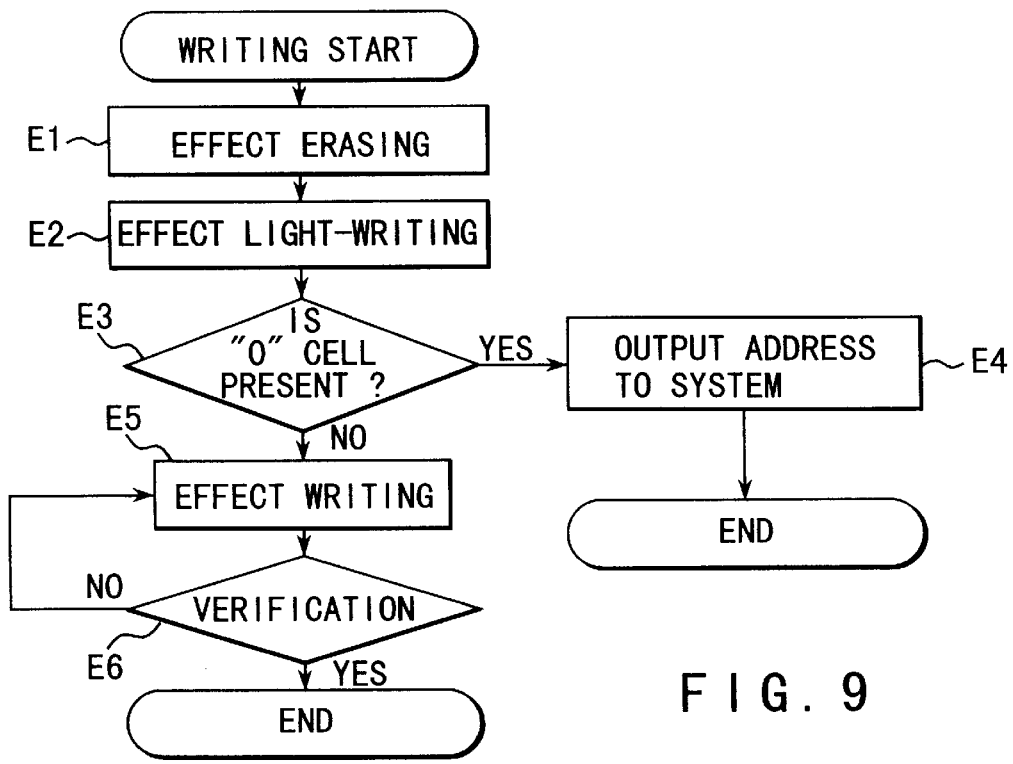
FIG. 9 is a flowchart for the operation of a fourth embodiment of the present invention.

FIG. 9 is a flowchart for the operation of a fourth embodiment of the present invention. In FIG. 9, a NAND nonvolatile memory device is taken as an example. In the fourth embodiment, the operation sequence is a write sequence into which the procedure for detecting a property-degraded cell whose threshold voltage fluctuates greatly is incorporated. If a property-degraded cell whose threshold voltage fluctuates greatly is present, its address will be outputted to the system and the operation be terminated.

First, after the write sequence has been started, a page of memory cells to be written into is erased from (step E1).

Thereafter, the word line to be written into is subjected to light-page-writing with a shorter pulse (e.g., 4 $\mu$sec) than the write pulse in an ordinary write operation such that the threshold voltage of a normal memory cell may be lower than the read voltage (step E2). The light-writing can be implemented using the same pulse width as that in an ordinary write operation. In that case, the write voltage is set in the range of 14 V to 16 V (at a voltage lower than the ordinary write voltage). Since a property-degraded cell 92 whose threshold voltage fluctuates heavily has a faster writing speed than that of a normal memory cell, it becomes a "0" cell as a result of light-writing.

Next, a check is made to see if there is a "0" cell (step E3). This makes it possible to easily identify a property-degraded cell whose threshold voltage fluctuates seriously. If there is a "0" cell, its address will be obtained and outputted to the system (step E4) and the operation be terminated.

If there is no "0" cell, normal writing and verification will be repeated (steps E5 and E6) and the write operation be completed.

While in the fourth embodiment, erasing and light-writing are done page by page, many pages may be subjected simultaneously to erasing and light-writing when the erasing area extends over many pages.

In the fourth embodiment, incorporating light-writing into the write sequence makes it possible to easily identify a property-degraded cell whose threshold voltage fluctuates seriously, resulting in an increase in the lifetime of the chip.

Figure 10:
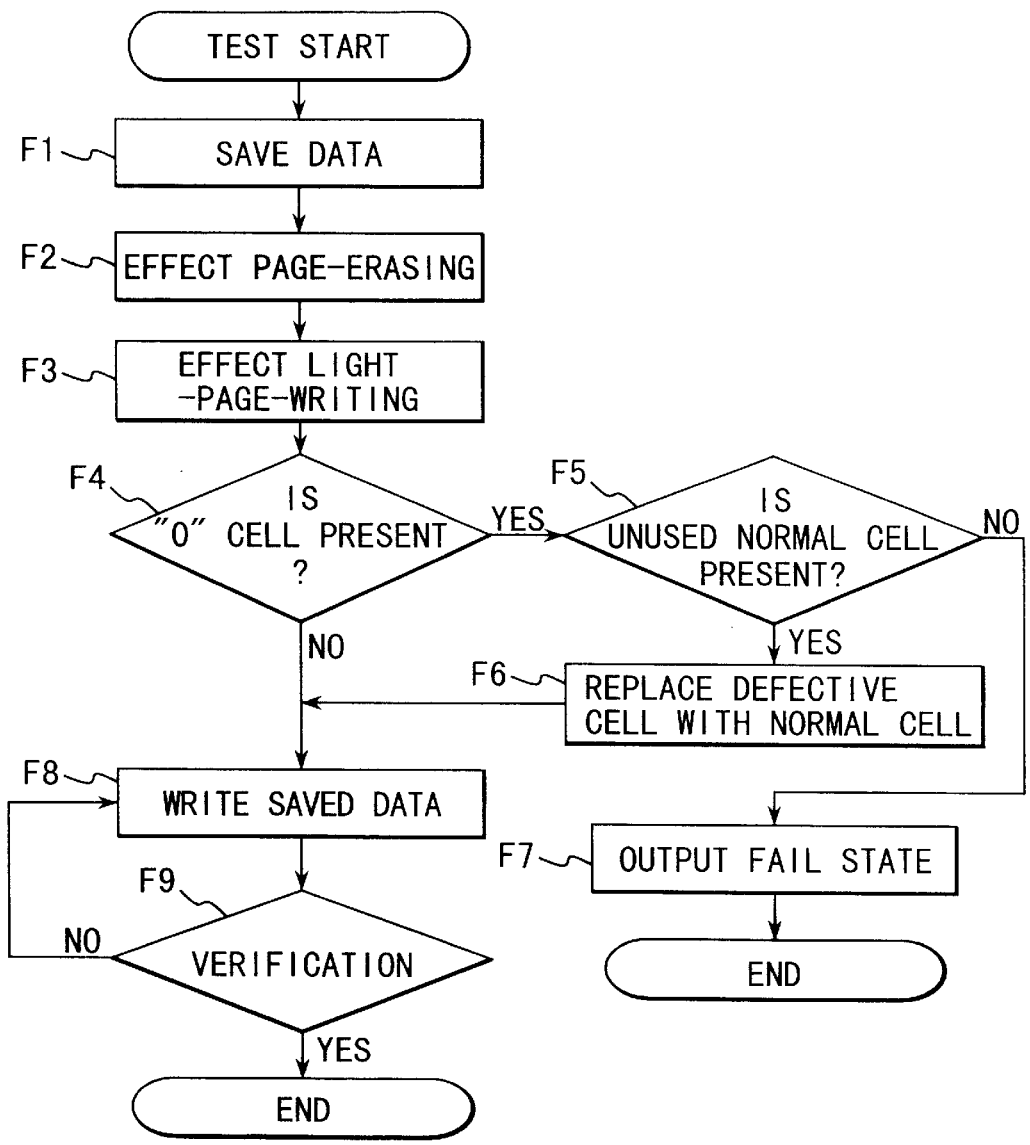
FIG. 10 is a flowchart for the operation of a fifth embodiment of the present invention.

FIG. 10 is a flowchart for the operation of a fifth embodiment of the present invention. In FIG. 10, a NAND nonvolatile memory device is taken as an example. In the fifth embodiment, the operation sequence is a test mode sequence into which the procedure for detecting a property-degraded cell whose threshold voltage fluctuates greatly is incorporated. If a property-degraded cell whose threshold voltage fluctuates greatly is present, it will be replaced with a normal memory cell. The test mode is started, for example, when the power is turned on, when a timer provided in a circuit has reached a certain time, or when a writing/erasure counter that counts the number of writings and erasures provided in a circuit has reached a specific set value.

For example, when the test mode is performed word line by word line, a data saving area for one word line is provided in the chip and the data in the memory cells connected to the word line to be tested is saved into the data saving area (step F1).

Next, the data in the memory cells connected to the selected word line is erased (step F2). At this time, applying the same potential as that of the well diffusion layer to the unselected word lines prevents the data in the unselected word lines from being erased.

Thereafter, the selected word line is subjected to light-page-writing with a shorter pulse (e.g., 4 $\mu$sec) than the write pulse in an ordinary write operation such that the threshold voltage of a normal memory cell may be lower than the read voltage (step F3). The light-writing can be implemented using the same pulse width as that in an ordinary write operation. In that case, the write voltage is set at 14 V to 16 V (at a voltage lower than the ordinary write voltage). Since a property-degraded cell 92 whose threshold voltage fluctuates heavily has a faster writing speed than that of a normal memory cell, it becomes a "0" cell as a result of light-writing.

Next, a check is made to see if there is a "0" cell (step F4). This makes it possible to easily identify a property-degraded cell whose threshold voltage fluctuates seriously.

If there is a "0" cell, a check will be made to see if there is an unused normal memory cell (step F5). If there is an unused normal memory cell, the "0" cell will be replaced with a normal memory cell (step F6). The normal memory cell may be a normal memory cell in the chip or a redundant memory cell prepared as a spare, for example, an EEPROM. Since a memory cell whose threshold voltage fluctuates seriously has the degraded insulating properties of its insulating film, there is a possibility that the ONO film or tunnel oxide film of the memory cell will be destroyed in use. In that case, even if only the memory cell has been replaced with a normal memory cell, the remaining normal memory cells on a word line or in a block to which the memory cell belongs may operate erroneously. To avoid this problem, replacing the defective memory cells with redundant memory cells word line by word line or block by block increases the reliability of the chip more.

If there is no unused normal memory cell, a signal indicating a replacement impossible state (a fail state) will be outputted to a circuit outside the memory (step F7) and the operation will be terminated.

When there is no "0" cell or when there is a "0" cell and it is replaced with a normal memory cell, the saved data is written and verified by the normal writing method repeatedly (step F8 and F9) and the operation is completed.

While in the fifth embodiment, the test mode is performed word line by word line, a data saving area may be used to carry out the test mode block by block. This enables erasing and light-writing to be done block by block, thereby shortening the test mode time.

As described above, in the fifth embodiment, incorporating light-writing into the test mode makes it possible to easily identify a property-degraded cell whose threshold voltage fluctuates seriously. Furthermore, replacing a property-degraded cell whose threshold voltage fluctuates seriously with a normal memory cell makes the lifetime of the chip longer.

Figure 11:
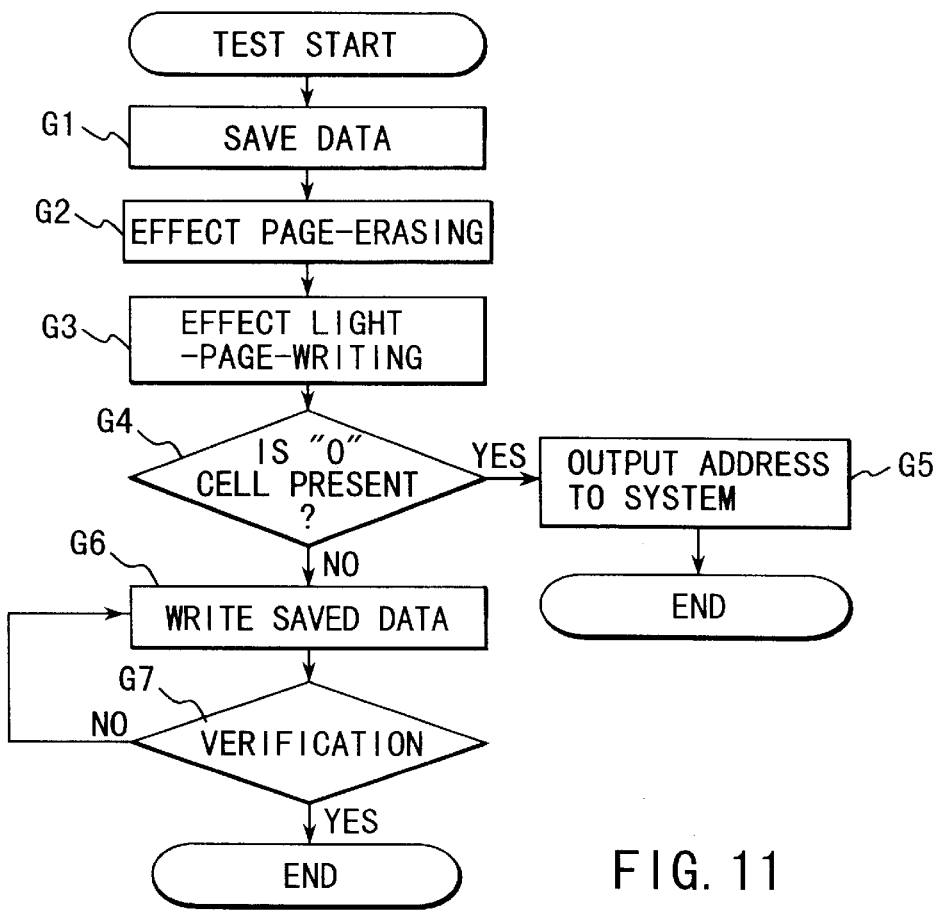
FIG. 11 is a flowchart for the operation of a sixth embodiment of the present invention.

FIG. 11 is a flowchart for the operation of a sixth embodiment of the present invention. In FIG. 11, a NAND nonvolatile memory device is taken as an example. In the sixth embodiment, the operation sequence is a test mode sequence into which the procedure for detecting a property-degraded cell whose threshold voltage fluctuates greatly is incorporated. If a property-degraded cell whose threshold voltage fluctuates greatly is present, its address will be outputted to the system. The test mode is started, for example, when the power is turned on, when a timer provided in a circuit has reached a certain time, or when a writing/erasure counter that counts the number of writings and erasures provided in a circuit has reached a specific set value.

For example, when the test mode is performed word line by word line, a data saving area for one word line is provided in the chip and the data on the selected word line is saved into the data saving area (step G1).

Next, the data in the memory cells for one page connected to the selected word line is erased (step G2). At this time, applying the same potential as that of the well diffusion layer to the unselected word lines prevents the data on the unselected word lines from being erased.

Thereafter, the selected word line is subjected to light-page-writing with a shorter pulse (e.g., 4 $\mu$sec) than the write pulse in an ordinary write operation such that the threshold voltage of a normal memory cell may be lower than the read voltage (step G3). The light-writing can be implemented using the same pulse width as that in an ordinary write operation. In that case, the write voltage is set in the range of 14 V to 16 V (at a voltage lower than the ordinary write voltage). Since a property-degraded cell 92 whose threshold voltage fluctuates heavily has a faster writing speed than that of a normal memory cell, it becomes a "0" cell as a result of light-writing.

Next, a check is made to see if there is a "0" cell (step F4). This makes it possible to easily identify a property-degraded cell whose threshold voltage fluctuates seriously.

If there is a "0" cell, its address will be obtained and outputted to the system (step G5) and the operation be terminated.

If there is no "0" cell, the saved data will be written and verified repeatedly (steps G6 and G7) and the operation be completed.

While in the sixth embodiment, the test mode is performed word line by word line, a data saving may be used to carry out the test mode block by block. In this case, erasing and light-writing can be done block by block, thereby shortening the test mode time.

As described above, in the sixth embodiment, incorporating light-writing into the test mode makes it possible to easily identify a property-degraded cell whose threshold voltage fluctuates seriously, resulting in an increase in the lifetime of the chip.

While in the sixth embodiment, a NAND nonvolatile memory has been taken as an example, use of a NOR nonvolatile memory produces the same effect, provided that it is operated in the same manner.

Figure 12:
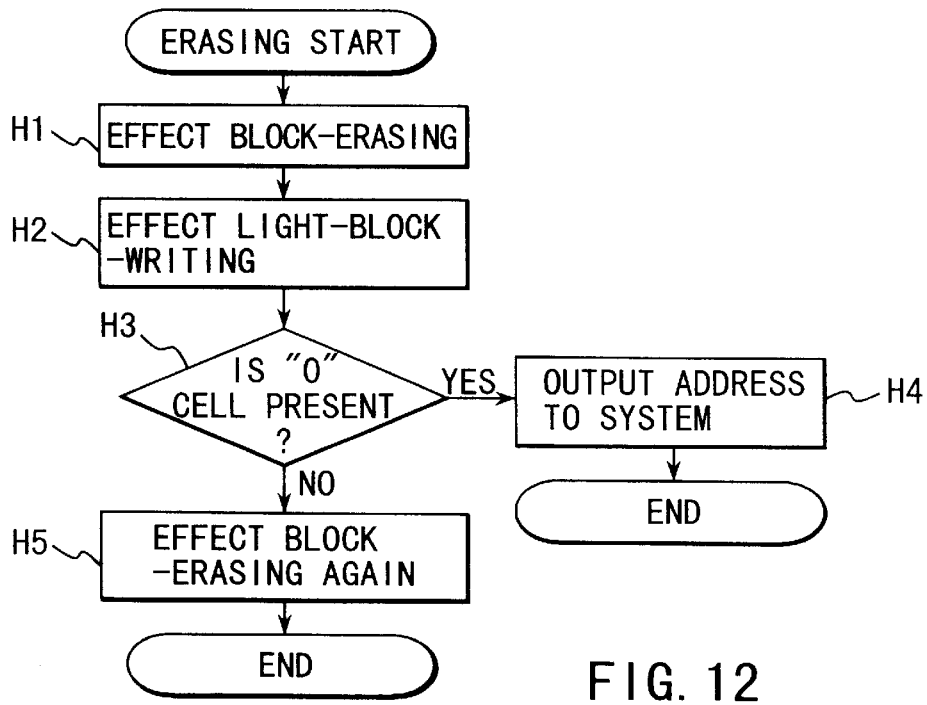
FIG. 12 is a flowchart for the operation of a seventh embodiment of the present invention.

In an ordinary electrically erasable and writable nonvolatile memory device, particularly a memory device of the type that has a charge storage layer and gives and receives charges to and from the layer in the form of tunnel current or lucky electrons, erasing is done before writing. Particularly, in a NOR, NAND, AND, or DINOR flash EEPROM device, a block is a unit of erasing. In a NAND flash EEPROM device, a unit of writing is a page. Therefore, when the test mode of the present invention is incorporated into the erase sequence as shown in FIG. 7, a method of performing block erasing and then carrying out light-writing block by block can be considered. FIG. 12 is a flowchart for the process of performing the test mode of the invention block by block.

First, after the erase sequence has been started, the data in the memory cells in the selected block is erased (step H1).

Thereafter, the selected word line is subjected to light-block-writing with a shorter pulse (e.g., 4 $\mu$sec) than the write pulse in an ordinary write operation such that the threshold voltage of a normal memory cell may be lower than the read voltage (step H2). The light-writing can be implemented using the same pulse width as that in an ordinary write operation. In that case, the write voltage is set in the range of 14 V to 16 V (at a voltage lower than the ordinary write voltage). Since a property-degraded cell 92 whose threshold voltage fluctuates heavily has a faster writing speed than that of a normal memory cell, it becomes a "0" cell as a result of light-writing.

Next, a check is made to see if there is a "0" cell (step H3). This makes it possible to easily identify a property-degraded cell whose threshold voltage fluctuates seriously.

If there is a "0" cell, its address will be obtained and outputted to the system (step H4) and the operation be terminated. If there is no "0" cell, block erasing is done again (step H5) and the operation be completed.

As described above, in the embodiment, incorporating light-writing into the erase sequence makes it possible to easily identify a property-degraded cell whose threshold voltage fluctuates seriously, resulting in an increase in the lifetime of the chip.

As described earlier, there is a strong possibility that a memory cell found in the test mode will undergo an intrinsic breakdown in the middle of repeating the erase and write operations after the test. If it has undergone an intrinsic breakdown, all of the memory cells sharing the word lines with the defective memory cell cannot be read from. Therefore, it is desirable that an address outputted to the system should be a row address.

In the case of a NAND nonvolatile semiconductor memory, if a word line in a block is destroyed, the memory cells connected to the other word lines in the block also cannot be read from. As a result, an address to be outputted may be a block address only.

Therefore, in the above embodiment, a NAND nonvolatile semiconductor memory enables use of block detecting to detect a "0" cell.

Figure 13:
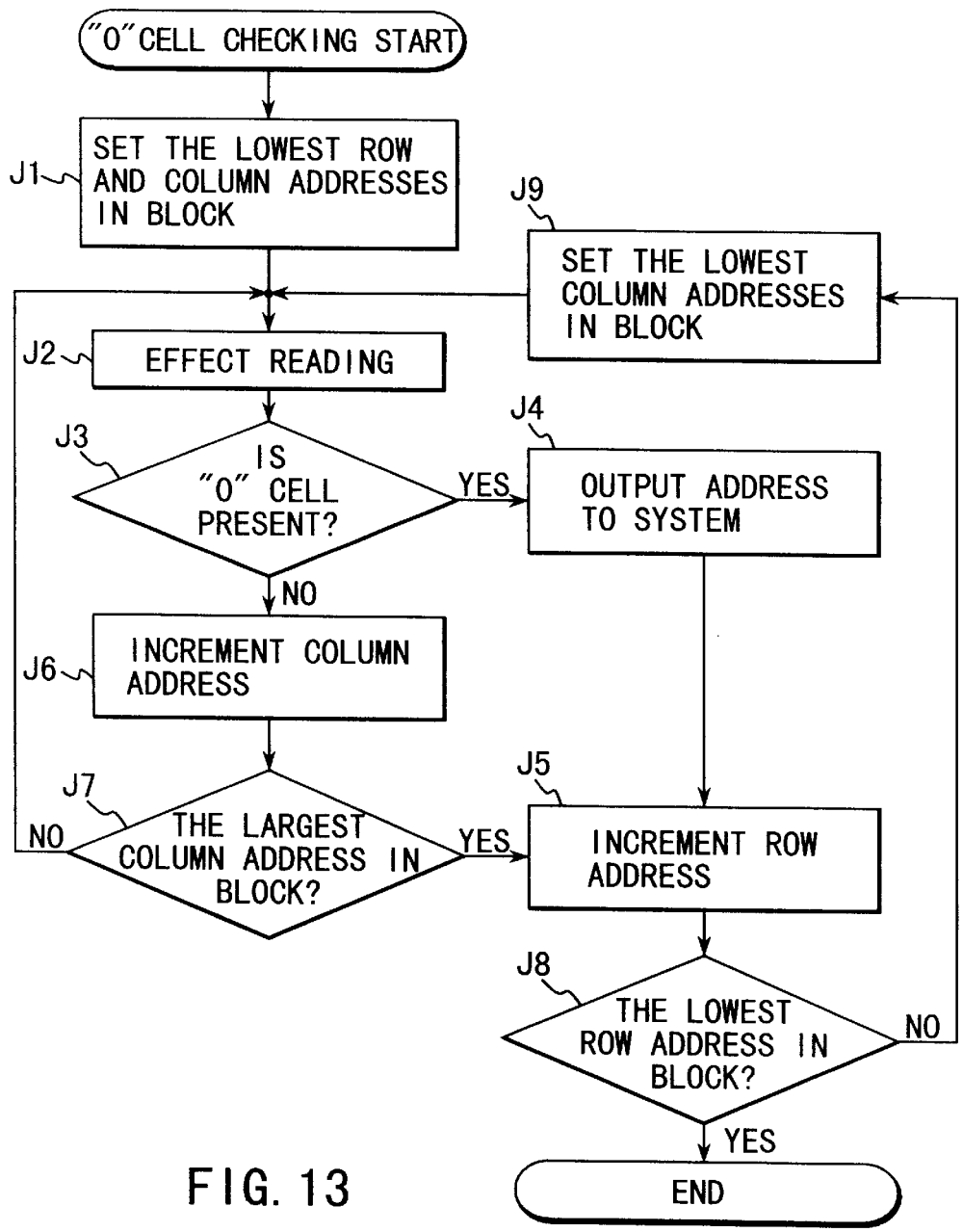
FIG. 13 is a flowchart for a method of checking to see if there is any "O" cell in a block.

In a NOR nonvolatile semiconductor memory, reading or verify-reading is usually done byte by byte. FIG. 13 is a flowchart for the process of checking for a "0" cell.

First, the lowest row address and column address in a block are set in an address generator provided in the memory (step J1) to read the data in the address (step J2). Then, a check is made to see if there is a "0" cell (step J3). If there is a "0" cell, only the address for the "0" cell will be outputted to the system (step J4) and the row address be incremented (step J5).

Conversely, at step J3, if there is no "0" cell, the column address will be incremented (step J6) and a check be made to see if the column address is the largest column address in the block (step J7). If it is the largest column address, the row address will be incremented (step J5). If it is not the largest column address, the data will be read and checked.

After the row address has been incremented at step J5, a check is made to see if the row address is the largest row address in the block (step J8). If it is not the largest row address, the column address will made the lowest column address in the block (step J9) and the data be read again and checked.

The check is made by scanning the addresses in the column address direction and then in the row address direction. Regarding the "0" cell, only the row address may be outputted.

Figure 14:
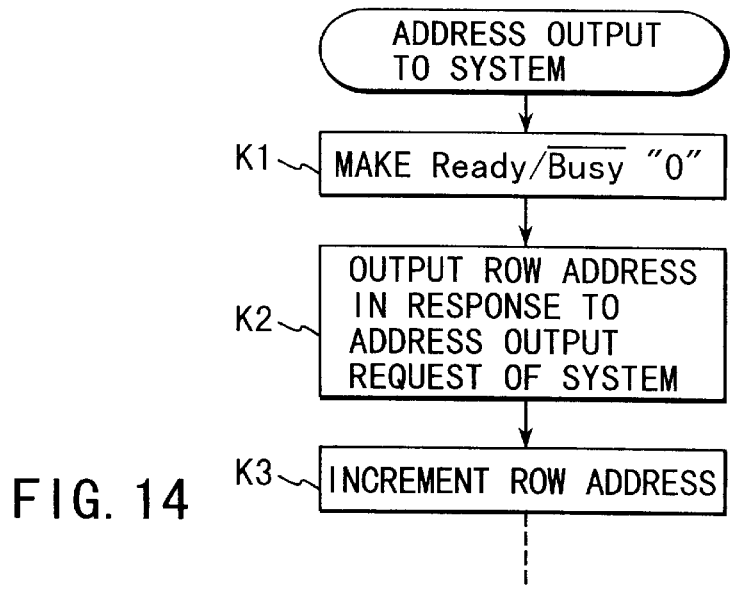
FIG. 14 shows part of a modification of the flowchart in FIG. 13.

In this case, the number of rows needing replacement is not necessarily limited to one. Therefore, the process when there is a "0" cell in FIG. 13 can be carried out as shown in FIG. 14. Specifically, when a "0" cell is present, a "0" is outputted to, for example, a pad called Ready/*Busy (* represents an inverted signal) (step K1) to tell the system that there is a row needing replacement. When the system requests the row address to be read, the chip meets the request and outputs the row address (step K2). Thereafter, the row address is incremented (step K3). The process from this time on is the same as that shown in FIG. 13.

While in FIG. 13, the lowest address in the block is set in the address generator and incremented, the largest address in the block may be set in the generator and decremented.

Figure 15:
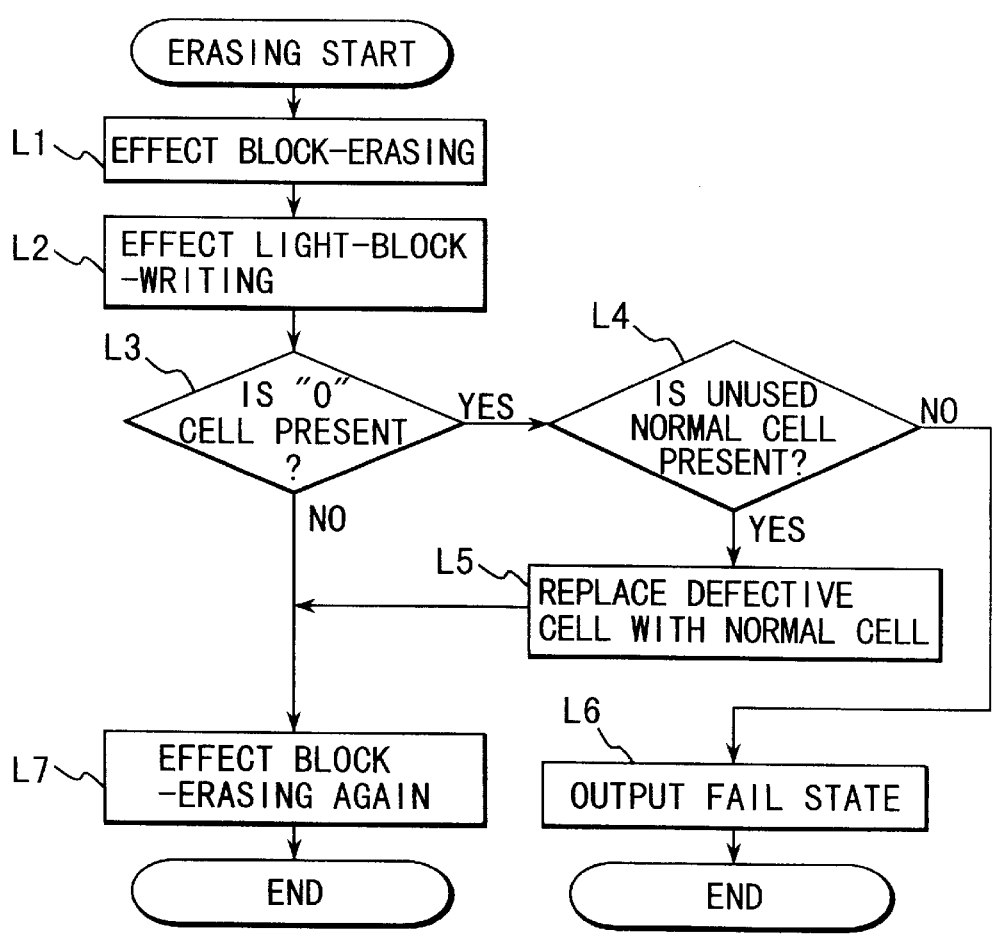
FIG. 15 is a flowchart for the operation of an eighth embodiment of the present invention.

FIG. 15 is a flowchart for the sequence of replacing the defective memory cell with a normal memory cell within the chip. In the present embodiment, erasing, light-writing, and rewriting are done block by block differently from the first embodiment where erasing, light-writing, and rewriting are done page by page. When there is a "0" cell, the defective memory cell is replaced with a normal memory cell block by block. Except for this point, the operation in the present embodiment (steps L1 to L7) is the same as that of the first embodiment (steps B1 to B7), so a detailed explanation of the operation will be omitted.

In the present embodiment, an unused normal memory cell means an unused normal block. For example, it indicates a spare memory cell block such as a redundant memory cell block or a memory cell block at an unused regular address. In the case of a system that writes data, starting at the block with the lowest address, when a memory cell block at a regular address is used for replacement, it is assumed that rewriting is done, starting at the block with the largest address in the chip. The address for the usable highest-order block at that time is stored in the chip. When writing is requested, if the write address is lower than the stored usable address, a write enable signal will be outputted.

Figure 16:
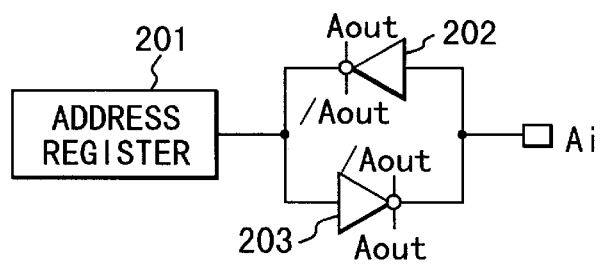
FIG. 16 shows a circuit for outputting an address by use of an address pad.

In the above embodiment, when the address needing replacement is outputted to the system, if the system uses the address lines as an I/O bus, an address pad should be used to output the address as shown in FIG. 16.

Specifically, as shown in FIG. 16, a clocked inverter 202 controlled by a signal Aout and a clocked inverter 203 controlled by a signal /Aout (/ represents an inverted signal) are provided between an address pad Ai and an address register 201. The clocked inverter 202 has its input terminal connected to the address pad Ai and its output terminal connected to the address register 201. The clocked inverter 203 has its input terminal connected to the address register 201 and its output terminal connected to the address pad Ai.

Figure 17:
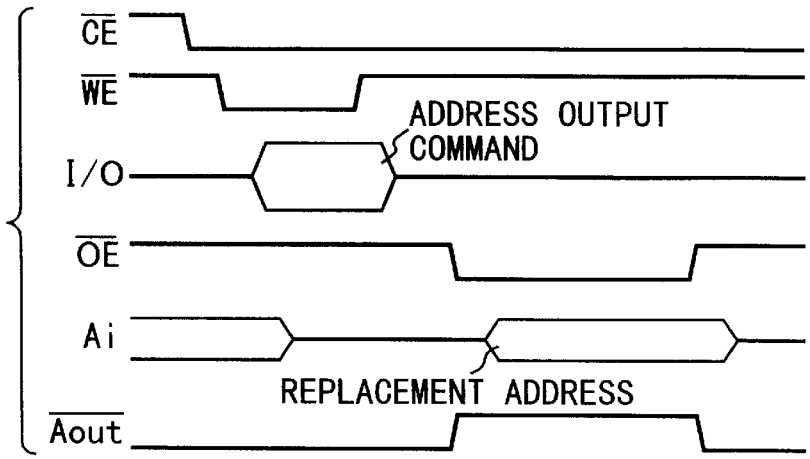
FIG. 17 is a timing chart for the operation of the circuit in FIG. 16.

FIG. 17 is a timing chart for the operation of the circuit shown in FIG. 16. In the address register 201, the address for the memory cell needing replacement has been stored. When an address output command has been externally supplied and a signal /OE (/ indicates an inverted signal) goes low, then the signal Aout goes high, causing the address needing replacement held in the address register 201 to be outputted to the address pad Ai.

When the address for the memory cell needing replacement is outputted to the I/O pad, the address is multiplexed and the outputted, because the number of bits of the address is larger than the number of I/O pads for outputting the address. For example, when the chip has a structure of 1M×8 bits, eight I/O pads and twenty addresses are required. Therefore, the address has to be divided into three parts and outputted. Even if only the row address is outputted, the address must be divided into at least two parts. When the address is multiplexed and outputted, it is necessary to determine an interface protocol, such as outputting the addresses in sequence, staring at the lowest address.

Figure 18:
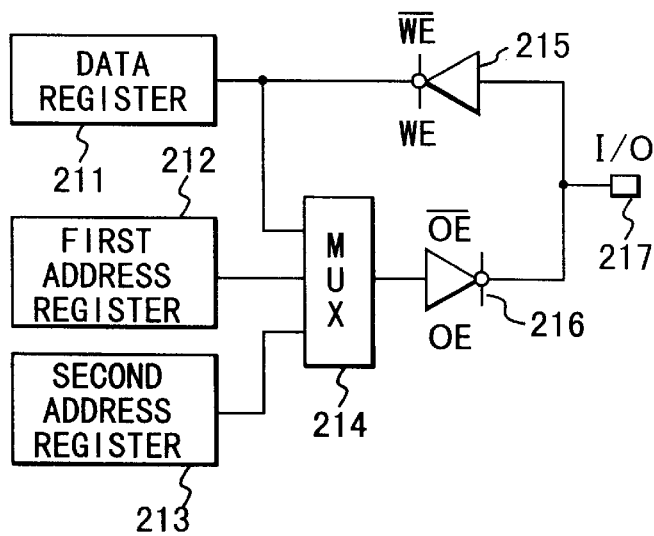
FIG. 18 shows a circuit for outputting an address by use of an I/O pad.

FIG. 18 is a block diagram of a circuit that divides an address into two parts and outputs them to the I/O pads. A data register 211, a first address register 212, and a second address register 213 are connected to a first, a second, and a third input terminal of a multiplexer 214, respectively. The output terminal of the multiplexer 214 is connected to the input terminal of a clocked inverter 216 controlled by a signal /OE (/ indicates an inverted signal). The output terminal of the clocked inverter 216 is connected to an I/O pad 217. The input terminal of a clocked inverter 215 controlled by a signal /WE is connected to an I/O pad 217. The output terminal of the clocked inverter 215 is connected to a data register 211.

Figure 19:
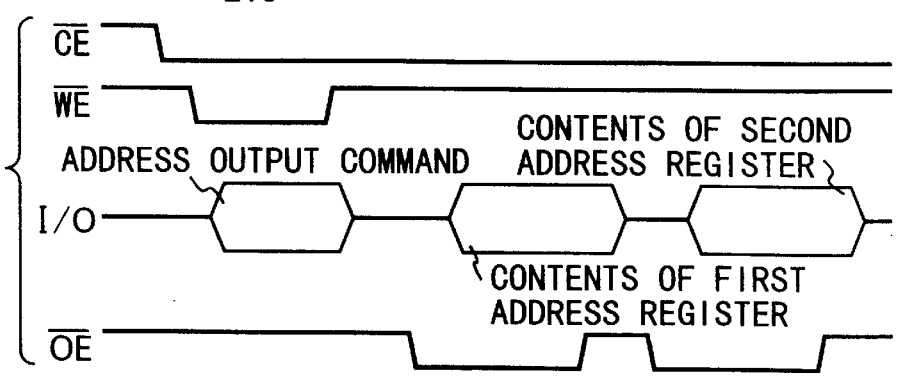
FIG. 19 is a timing chart for the operation of the circuit in FIG. 18.

FIG. 19 is a timing chart for the operation of the circuit of FIG. 17. The first address register 212 and second address register 213 have held, for example, the least-significant bit and the most-significant bit of the memory cell needing replacement, respectively. When an address output command is externally supplied and the signal /OE (/ indicates an inverted signal) goes low, the low-order address held in the first address register 212 is outputted via the multiplexer 214 to the I/O pad 217. When the signal /OE (/ indicates an inverted signal) goes high and then low, the high-order address held in the second address register 213 is outputted via the multiplexer 214 to the I/O pad 217.

As explained above in detail, with the present invention, because light-writing turns only a memory cell whose threshold voltage fluctuates seriously into a "0" cell, such a property-degraded cell can be found easily, thereby improving the lifetime of a nonvolatile semiconductor memory device.

Furthermore, incorporating light-writing into the erase sequence, the write sequence, or the test sequence enables a property-degraded cell whose threshold voltage fluctuates seriously to be found automatically, resulting in an increase in the lifetime of a nonvolatile semiconductor memory device.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A nonvolatile semiconductor memory device comprising:
   a memory cell array in which electrically erasable and writable nonvolatile memory cells are arranged;
   a control circuit for erasing data in at least part of the memory cells in said memory cell array and effecting light-writing by applying a bias to the part of the memory cells such that an electric field smaller than in an ordinary write operation may develop at gate insulating films of the memory cells; and
   a detecting circuit for detecting a property-degraded cell which is in a written state from among said memory cells subjected to light-writing.

2. A nonvolatile semiconductor memory device comprising:
   a memory cell array in which electrically erasable and writable nonvolatile memory cells are arranged;
   a control circuit for erasing data in at least part of the memory cells in said memory cell array and effecting light-writing by applying to the part of the memory cells a bias whose pulse width is shorter or whose write voltage is lower than in an ordinary write operation; and
   a detecting circuit for detecting a property-degraded cell which is in a written state from among said memory cells subjected to light-writing.

3. A nonvolatile semiconductor memory device according to claim 2, further comprising a replacement control circuit for performing control to replace the property-degraded cell with an unused normal cell in accordance with said detecting circuit detecting the property-degraded cell.

4. A nonvolatile semiconductor memory device according to claim 3, wherein said replacement control circuit selects said unused normal memory cell from a redundant memory cell array.

5. A nonvolatile semiconductor memory device according to claim 3, wherein said replacement control circuit outputs a replacement impossible signal when there is no unused normal memory cell.

6. A nonvolatile semiconductor memory device according to claim 2, wherein said detecting circuit outputs an address for said property-degraded cell when detecting the property-degraded cell.

7. A nonvolatile semiconductor memory device according to claim 6, further comprising a replacement circuit for performing control to replace the property-degraded cell with an unused normal cell in accordance with the address outputted from said detecting circuit.

8. A nonvolatile semiconductor memory device according to claim 7, wherein said replacement control circuit includes a circuit for storing the address for the property-degraded cell outputted from said detecting circuit.

9. A nonvolatile semiconductor memory device according to claim 2, wherein said control circuit executes an ordinary erase operation after effecting said light-writing and detecting.

10. A nonvolatile semiconductor memory device according to claim 2, wherein said control circuit executes an ordinary write operation after effecting said light-writing and detecting.

11. A nonvolatile semiconductor memory device according to claim 2, wherein said control circuit writes specific data previously saved for a test mode process after effecting light-writing and detecting.

12. A method of operating a nonvolatile semiconductor memory device, comprising the steps of:
   erasing data in at least part of memory cells in a memory cell array in which electrically erasable and writable nonvolatile memory cells are arranged;
   effecting light-writing by applying a bias to the part of the memory cells erased from such that an electric field smaller than in an ordinary write operation may develop at gate insulating films of the memory cells; and
   detecting a property-degraded cell which is in a written state from among said memory cells subjected to light-writing.

13. A method of operating a nonvolatile semiconductor memory device, comprising the steps of:
   erasing data in at least part of memory cells in a memory cell array in which electrically erasable and writable nonvolatile memory cells are arranged;
   effecting light-writing by applying to the part of the memory cells erased from a bias whose pulse width is shorter or whose write voltage is lower than in an ordinary write operation; and
   detecting a property-degraded cell which is in a written state from among said memory cells subjected to light-writing.

14. A method according to claim 13, further comprising the step of performing control to replace the property-degraded cell with an unused normal cell when the property-degraded cell has been detected in said detecting step.

15. A method according to claim 14, wherein said replacement control step includes selecting said unused normal memory cell from a redundant memory cell array.

16. A method according to claim 14, wherein said replacement control step includes the step of outputting a replacement impossible signal when there is no unused normal memory cell.

17. A method according to claim 13, wherein said detecting step includes the step of outputting an address for said property-degraded cell when detecting the property-degraded cell.

18. A method according to claim 17, further comprising the step of replacing the property-degraded cell with an unused normal cell in accordance with the address outputted in said detecting step.

19. A method according to claim 13, further comprising the step of executing an ordinary erase operation after said light-writing step and said detecting step.

20. A method according to claim 13, further comprising the step of executing an ordinary write operation after said light-writing step and said detecting step.

21. A method according to claim 13, further comprising the step of writing specific data previously saved for a test mode process after said light-writing step and said detecting step.

* * * * *

UNITED STATES PATENT AND TRADEMARK OFFICE
CERTIFICATE OF CORRECTION

PATENT NO.: 5,930,169

DATED: July 27, 1999

INVENTORS: Yoshihisa IWATA, *et al.*

It is certified that an error appears in the above-identified patent and that said Letters Patent is hereby corrected as shown below:

On the cover page, under [30] Foreign Application Priority Data, delete "19" and insert --10--.

Signed and Sealed this

Eighteenth Day of July, 2000

Attest:

Q. TODD DICKINSON

*Attesting Officer*  *Director of Patents and Trademarks*